(12) United States Patent  
Hohenwarter

(10) Patent No.: US 8,926,788 B2
(45) Date of Patent: Jan. 6, 2015

(54) CLOSED CHAMBER FOR WAFER WET PROCESSING

(75) Inventor: Karl-Heinz Hohenwarter, Dellach-Gail (AT)

(73) Assignee: Lam Research AG, Villach (AT)

(*) Notice: Subject to any disclaimer, the term of this patent is extended or adjusted under 35 U.S.C. 154(b) by 786 days.

(21) Appl. No.: 12/913,405

(22) Filed: Oct. 27, 2010

(65) Prior Publication Data

US 2012/0103522 A1    May 3, 2012

(51) Int. Cl.
*H01L 21/465* (2006.01)
*H01L 21/67* (2006.01)

(52) U.S. Cl.
CPC ...... *H01L 21/6719* (2013.01); *H01L 21/67126* (2013.01)
USPC ............ 156/345.21; 156/345.23; 156/345.11; 156/345.55; 156/345.18; 156/345.22

(58) Field of Classification Search
USPC ............. 156/345.21–345.23, 345.11, 345.55, 156/345.18
See application file for complete search history.

(56) References Cited

U.S. PATENT DOCUMENTS

| | | |
|---|---|---|
| 4,903,717 A | 2/1990 | Sumnitsch |
| 5,513,668 A | 5/1996 | Sumnitsch |
| 6,273,104 B1 | 8/2001 | Shinbara et al. |
| 6,383,331 B1 | 5/2002 | Sumnitsch |
| 6,793,769 B2 * | 9/2004 | Kajino et al. ............ 156/345.55 |
| 6,807,974 B2 | 10/2004 | Ono et al. |
| 6,915,809 B2 | 7/2005 | Shibagaki |
| 7,479,205 B2 * | 1/2009 | Okuda et al. ............. 156/345.18 |
| 7,722,736 B2 * | 5/2010 | Miya ........................ 156/345.17 |
| 8,398,812 B2 * | 3/2013 | Kim et al. ................ 156/345.22 |
| 8,398,817 B2 * | 3/2013 | Namba et al. ............ 156/345.55 |
| 2003/0047192 A1 | 3/2003 | Ono et al. |
| 2004/0157430 A1 | 8/2004 | Mandal |
| 2007/0243711 A1 * | 10/2007 | Iwashita et al. ............... 438/694 |
| 2012/0103522 A1 * | 5/2012 | Hohenwarter .......... 156/345.23 |
| 2013/0008602 A1 * | 1/2013 | Hohenwarter .......... 156/345.23 |

FOREIGN PATENT DOCUMENTS

| | | |
|---|---|---|
| EP | 0137947 | 4/1985 |
| WO | 2004084278 | 9/2004 |

OTHER PUBLICATIONS

Imai et al., Effect of Dissolved Oxygen on Cu Corrosion in Single Wafer Cleaning Process, The Japan Society of Applied Physics 2009, Japanese Journal of Applied Physics, vol. 48, 04C023 pp. 1-4.
International Search Reported dated May 9, 2012 in International application No. PCT/IB 11/54377.

* cited by examiner

*Primary Examiner* — Sylvia R MacArthur
(74) *Attorney, Agent, or Firm* — Young & Thompson

(57) ABSTRACT

An improved design for a closed chamber process module for single wafer wet processing utilizes a combination lid and gas showerhead for sealing the chamber from above. One or more media arms dispense liquid onto a wafer in the chamber. The media arms are mounted inside the chamber but are connected by a linkage that passes through the chamber wall to a drive unit mounted outside the chamber.

15 Claims, 11 Drawing Sheets

CLOSED CHAMBER FOR WAFER WET PROCESSING

BACKGROUND OF THE INVENTION

1. Field of the Invention

The invention relates generally to an apparatus for treating surfaces of wafer-shaped articles, such as semiconductor wafers.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

With increasing miniaturization of the devices fabricated on semiconductor wafers, processing those wafers in an oxygen-containing atmosphere becomes more problematic. For example, when wafers undergo wet processing in stations that are open to the surrounding air, the oxygen content of the air causes unwanted corrosion of copper on the front side of the wafer.

A need therefore exists for wafer processing stations in which the gas atmosphere can be controlled, yet which permit performing a variety of processes on a wafer loaded in the processing module.

In U.S. Pat. No. 6,273,104, FIGS. 6 and 7 depict a showerhead that is smaller than the pot opening and thus cannot seal with the pot.

In U.S. Pat. Nos. 6,807,974 and 6,915,809, a gas injection section 30 is said to provide a sealed chamber only during drying of a wafer, whereas during wet processing of the wafer a much larger outer enclosure 1 is the only isolation of the process module and associated drive mechanisms. Moreover, the gas injection section 30 and liquids injection section 4 of these patents cannot work simultaneously.

SUMMARY OF THE INVENTION

The present inventor has developed an improved closed chamber module, preferably designed for single wafer wet processing. In the closed chamber module, arms for dispensing media onto a wafer are mounted within the chamber, and movable from a standby position to a service position. The closed chamber module comprises a movable upper lid that seals the chamber, and which is preferably also adapted to supply gas into the chamber.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
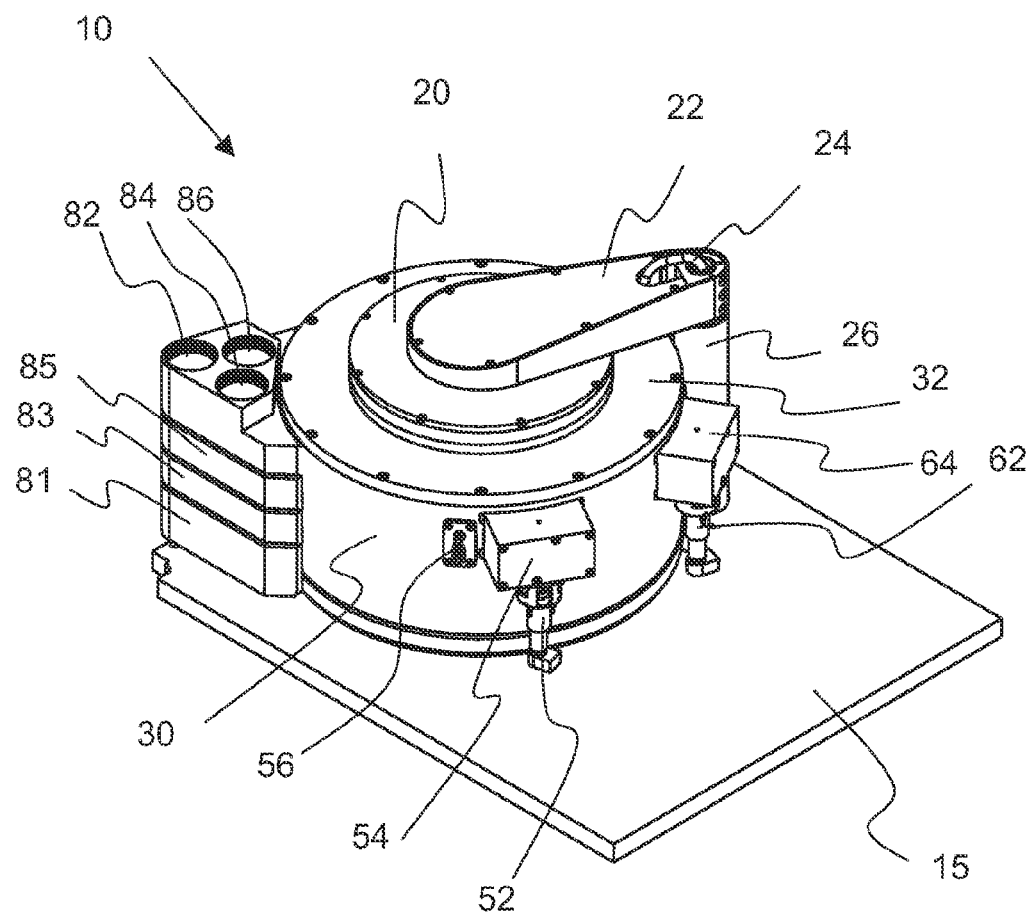
FIG. 1 is a perspective view of a preferred embodiment of a closed chamber module according to the present invention.

Referring to FIG. 1, a closed chamber module 10 is mounted on a base plate 15, and is constituted by a preferably cylindrical chamber wall 30 and an annular upper chamber cover 32 secured to the chamber wall 30 by a series of screws or the like. The chamber module 10 is closed at its upper end by shower head lid 10, which seals at its outer periphery to the inner periphery of the annular upper chamber cover 30.

Figure 2:
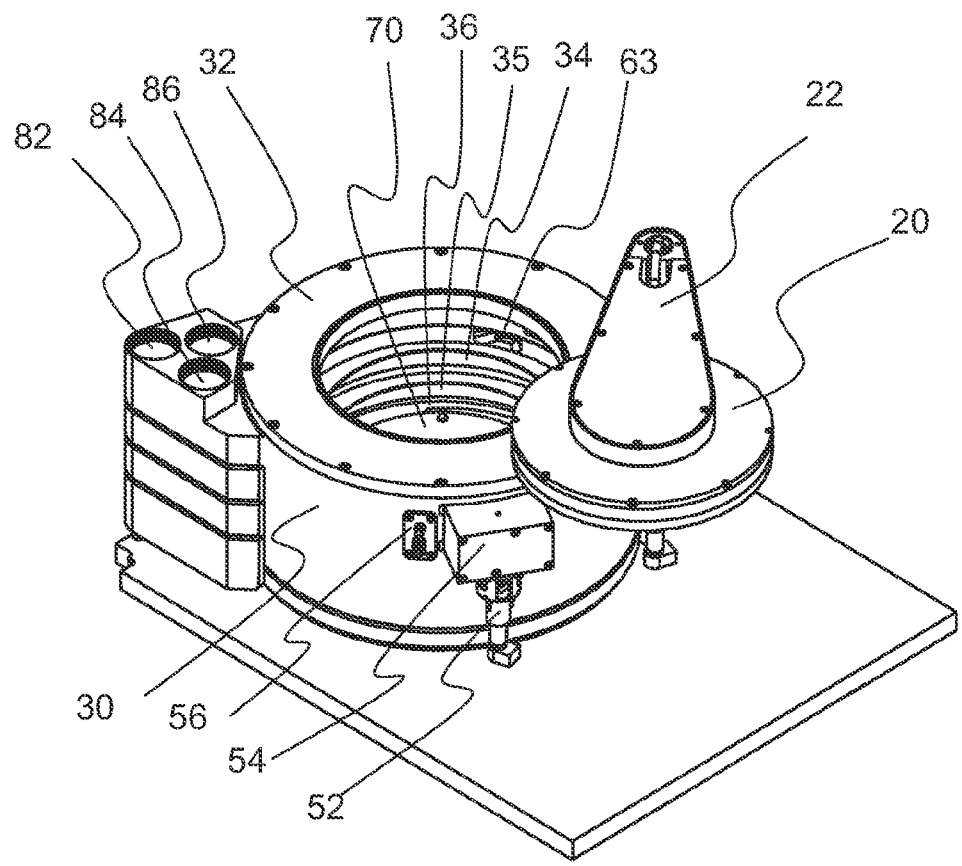
FIG. 2 is a view similar to FIG. 1, in which the shower head lid has been moved up and away from the module, so as to permit loading or unloading of the module.

Lid 20 is secured to lid arm 22, which moves the lid 20 from the closed position shown in FIG. 1 to the open position shown in FIG. 2, and which is in turn positioned on lid support shaft 26. A gas feed line 24 supplies gas to the shower head lid 20.

First and second drive units 52, 62 are provided for respective media supply arms to be described below, and lead to respective covers 54, 64 for the pivotal movement mechanisms for the media supply arms. Reference numeral 56 denotes a lead-in for the first media supply line.

The closed chamber module of this embodiment has three interior levels, each of which has an associated gas exhaust, with reference numerals 82, 84 and 86 in FIG. 1 denoting the associated exhausts for the lower, middle and upper levels, respectively and 81, 83 and 85 denoting the associated lower, middle and upper gas suctions for those exhausts.

Referring now to FIG. 2, the closed chamber module is shown in its open position, which involves both raising the shower head lid upwardly relative to the chamber and pivoting it about the lid support shaft 26, which accommodates the hollow shaft 18.

Inside the chamber, spin chuck 70 is visible, which in this embodiment is a chuck of the double-sided type. Also visible are the second media supply arm 63 in its standby position, and upper, middle and lower levels 34, 35, 36.

Figure 3:
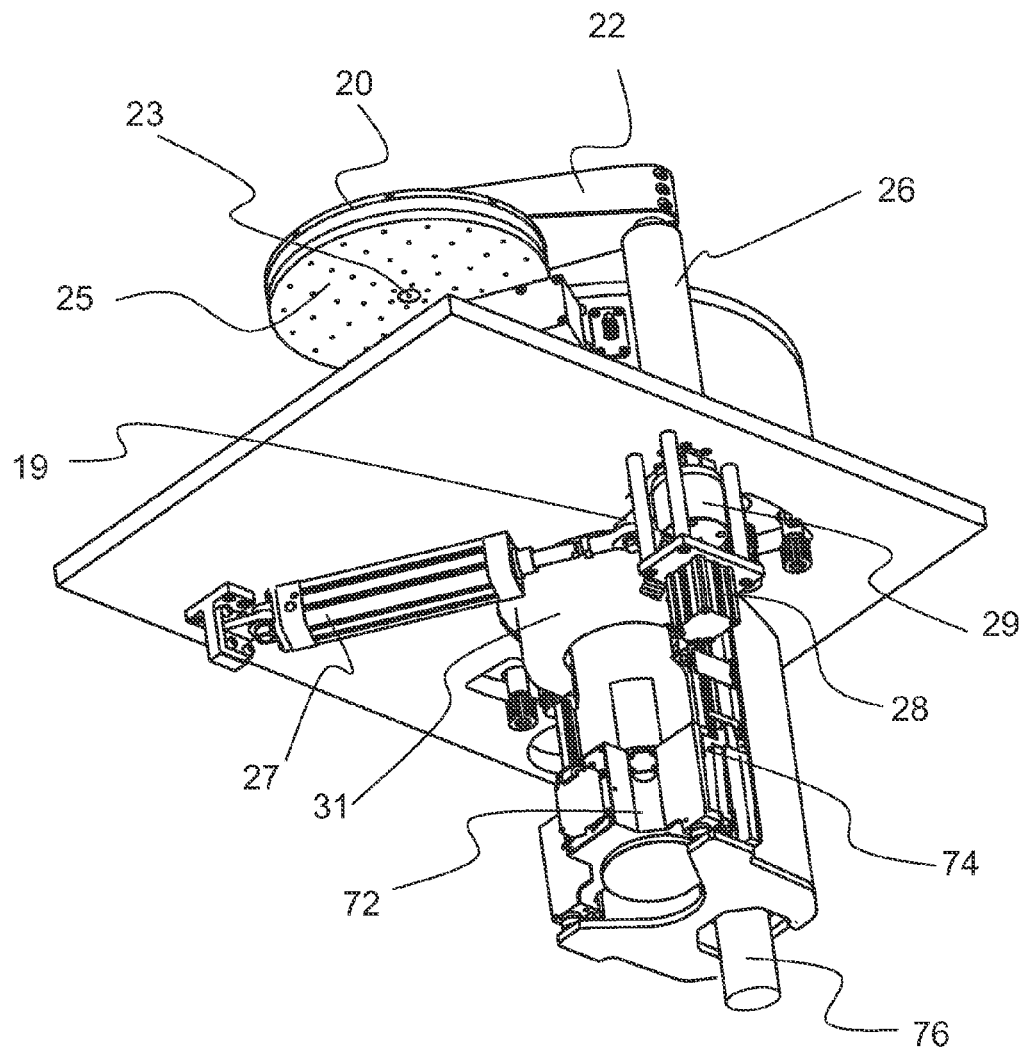
FIG. 3 is a perspective view of the FIG. 1 embodiment from below, showing various of the mechanisms used to operate the module.

In FIG. 3, the shower head region 25 is shown on the underside of the shower head lid 20, which region also includes a central gas nozzle 23 in addition to the plurality of gas openings.

Figure 4:
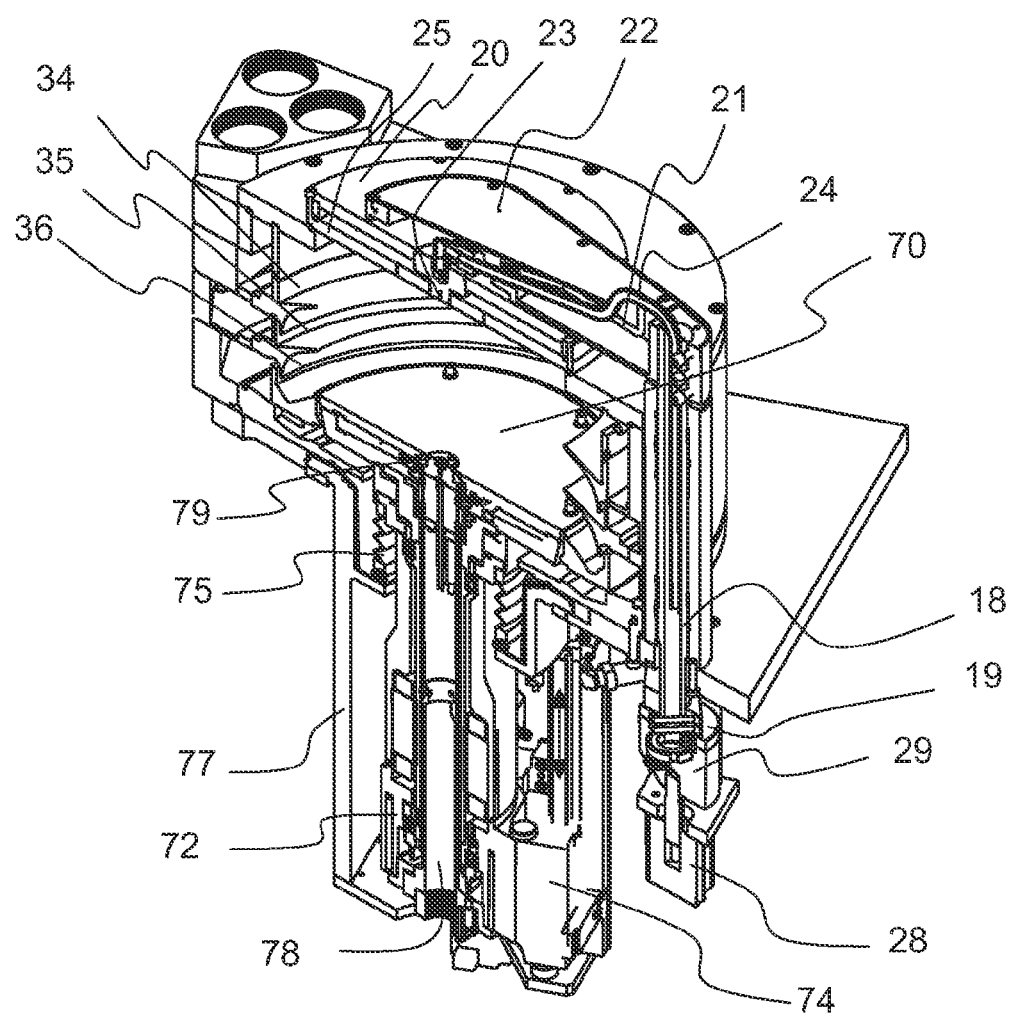
FIG. 4 is another perspective view of the FIG. 1 embodiment, sectioned in an axial plane, so as to illustrate internal components thereof.

Motor 27 drives link 19, which in turn drives hollow shaft 18 (see FIG. 4). Motor 27 thus drives the pivotal movement of shower head lid 20. Motor 28 is a lifting motor for raising and lowering the shower head lid 20, whereas 29 denotes a lead-in for the gas feed lines 21, 24 that are accommodated in the hollow shaft 18.

A spin motor 72 spins the spin chuck 70, whereas motor 76 raises and lowers spin chuck 70 via slider 74. A lower chamber cover 31 accommodates the bellows of the spin chuck, as will be described below.

In FIG. 4, the upper, middle and lower levels 34, 35 and 36 are more readily visible. The structure of these levels and their respective exhausts 86, 84 and 82 may be as described in commonly-owned application WO 2004/084278 A1. Also visible in FIG. 4 is the gas feed line 21 for the central gas nozzle 23, an expansion bellows 75 that serves to isolate the drive mechanisms from the interior ambient of the chamber, a frame 77 that connects the chuck drive mechanism to the underside of the chamber, a non-rotating nozzle head 79 supplying the bottom nozzles of the chuck, and a non-rotating hollow shaft 78 accommodating the bottom nozzle head 79.

Figure 5:
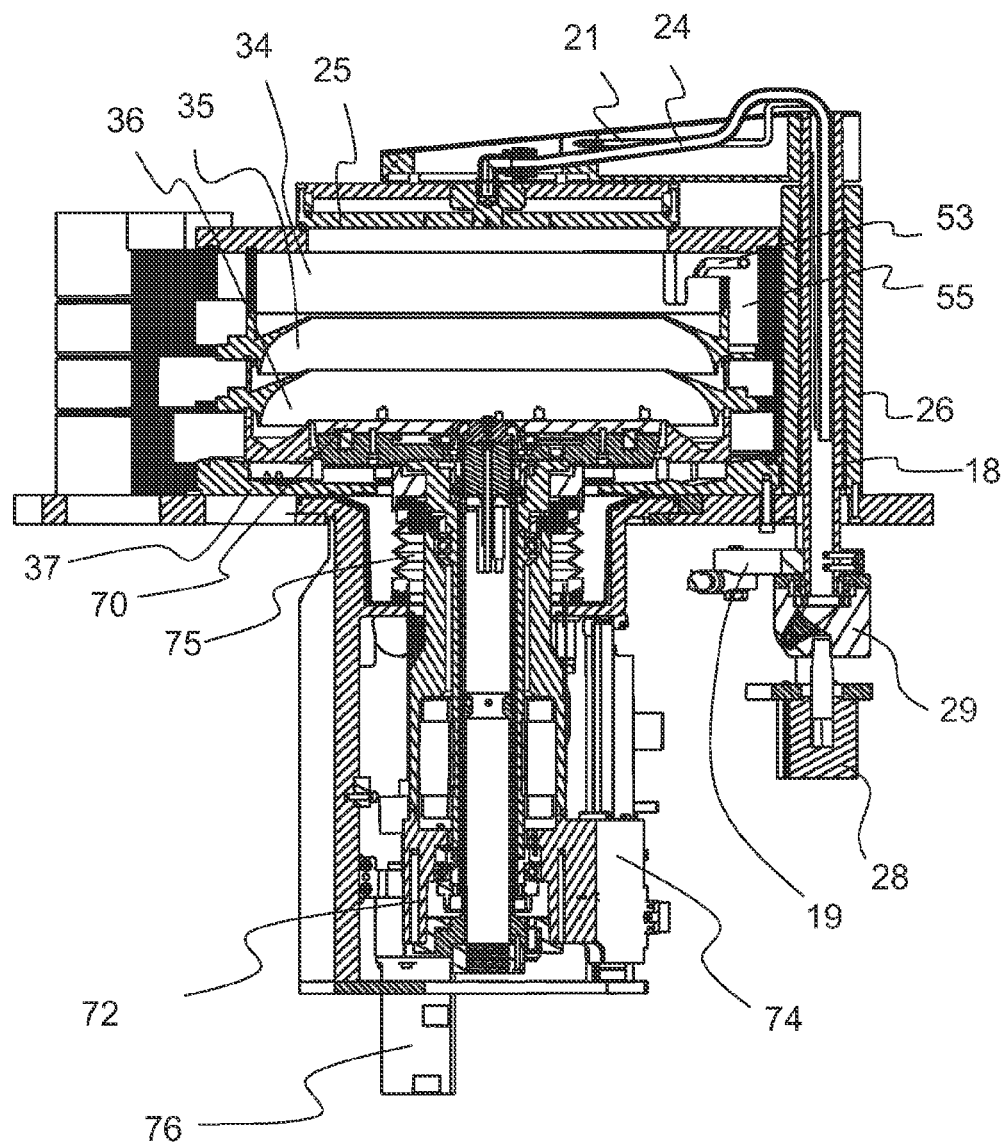
FIG. 5 is an axial cross-section of the FIG. 1 embodiment, in the same plane as that of FIG. 4.

The axial cross-section of FIG. 5 shows the afore-mentioned components in greater detail, along with the plate 37 defining the chamber bottom, the first media supply arm 53 shown in its standby position, and the stowage area 55 for the arm 53. It will be noted that shaft 18 is rigidly secured to lid arm 22, such that the rotational and translational movements imparted to shaft 18 are imparted to lid arm 22 and lid 20 as well, as described below.

Figure 6:
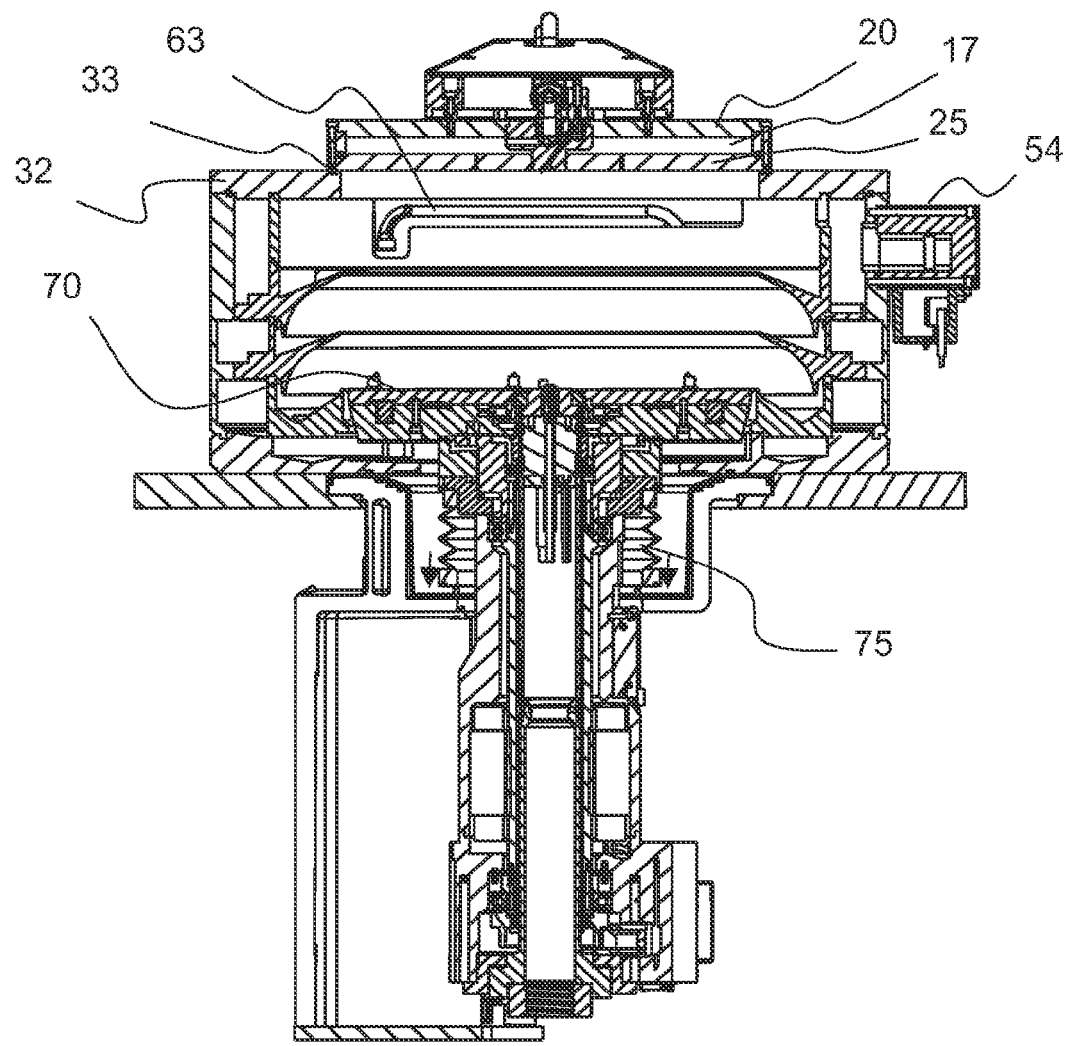
FIG. 6 is an axial cross-section of the FIG. 1 embodiment in a plane that intersects the pivotal mounting of one of the media supply arms.

In the axial cross-section of FIG. 6, the sectioning plane passes through the cover 54 of the pivot mechanism for the first media supply arm 53. From this angle, the second media supply arm 63 is fully visible in its standby position. Reference numeral 17 denotes a pressure-equalizing chamber with the gas showerhead lid 20. An annular seal 33 such as an O-ring or V-seal is attached to or seated in the annular upper chamber cover 32, to form a seal with the showerhead lid 20.

Figure 7:
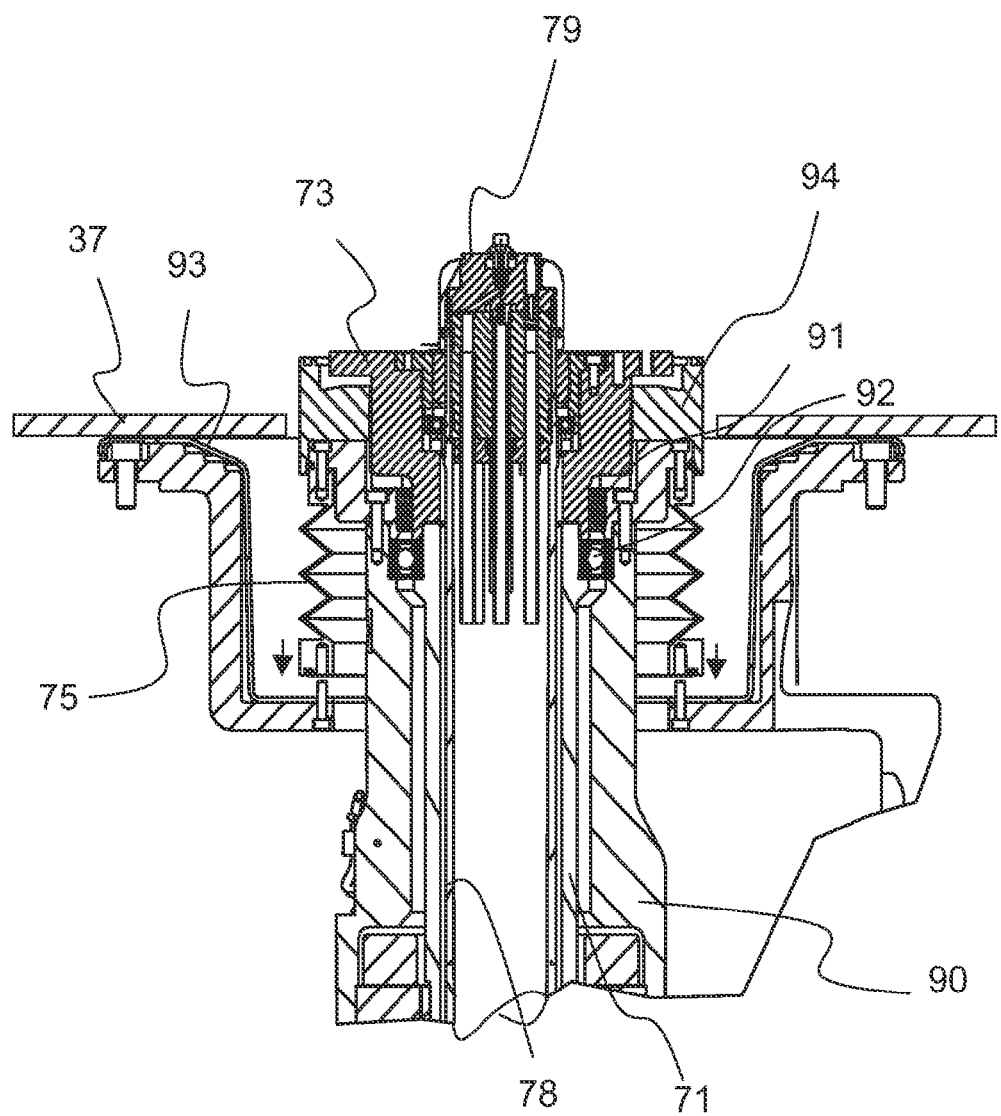
FIG. 7 is a sectional view illustrating the mechanism for driving and raising and lowering the spin chuck of this embodiment.

Turning now to FIG. 7, the mechanism for rotating the spin chuck carrier 73 comprises a rotating hollow shaft 71 that drives the spin chuck carrier 73 in rotation, the expansion bellows 75 that shields the drive mechanisms from the interior ambient of the chamber, frame 77 connecting the chuck drive mechanism to the underside of the chamber, non-rotating nozzle head 79 supplying the bottom nozzles of the chuck, and non-rotating hollow shaft 78 accommodating the bottom nozzle head 79.

Non-rotating hollow shaft 90 surrounds rotating hollow shaft 71, which in turn surrounds non-rotating hollow shaft 78, these three shafts being coaxial with one another. Rotary shaft seal bearing 91 seals the coaxial shafts from the chamber ambient and supports the interconnected rotary hollow shaft 78 and chuck carrier 73, whereas bearing 92 connects the non-rotating upper ring 94 with the rotating shaft 71. Membrane cover 93 is fitted within lower chamber cover 31, and at its inner periphery seals against bellows 75, and at its outer periphery seals against the chamber bottom 37.

Figure 8:
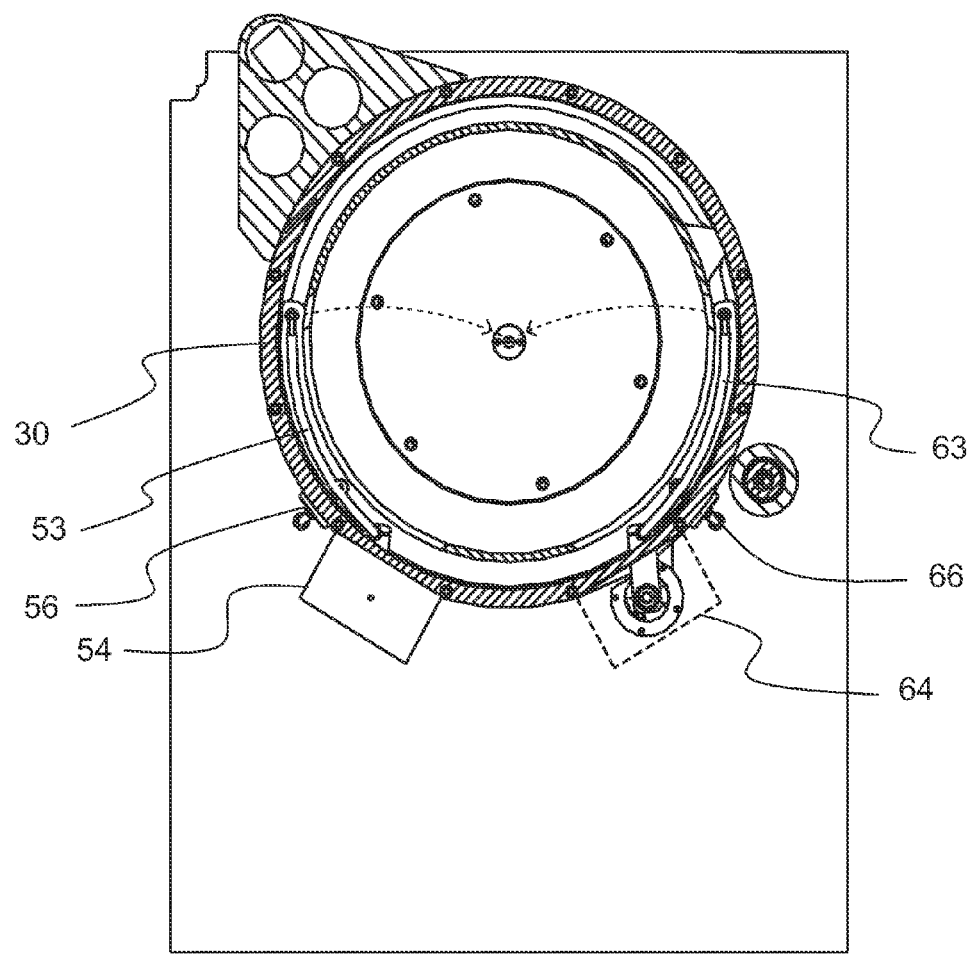
FIG. 8 is a radial section of the FIG. 1 embodiment, illustrating the media supply arms in their standby position.

In FIG. 8, the radial section through the cylindrical chamber wall 30 reveals first and second media supply arms 53 and 63 in their standby position, with the broken lines in FIG. 8 tracing the arcuate path that the dispensing ends of the media arms 53, 63 travel as they are moved from the illustrated standby position to the service position in which the dispensing end of the media arm will be approximately centered over the spin chuck. In practice only one of the media arms will be in use and hence in its service position at any given time, that is, although the media supply arms 53, 63 will often both be in the standby position as illustrated, in use typically only one or the other will be in the service position. Nevertheless, both media supply arms 53, 63 can move simultaneously, however alternatively approaching the centre, which can be achieved by appropriate software commands.

In referring to a service position for the media supply arms 53, 63, it will be understood that there can be more than one service position, or for that matter the arms may be in service as they move radially inwardly from the peripheral standby position. Therefore, the service position can refer to any position where the dispensing end of the media supply arm is positioned above a wafer supported on the chuck, and not merely the central innermost position. For instance the service position will move from centre towards the edge and back again during processing of the wafer.

Figure 9:
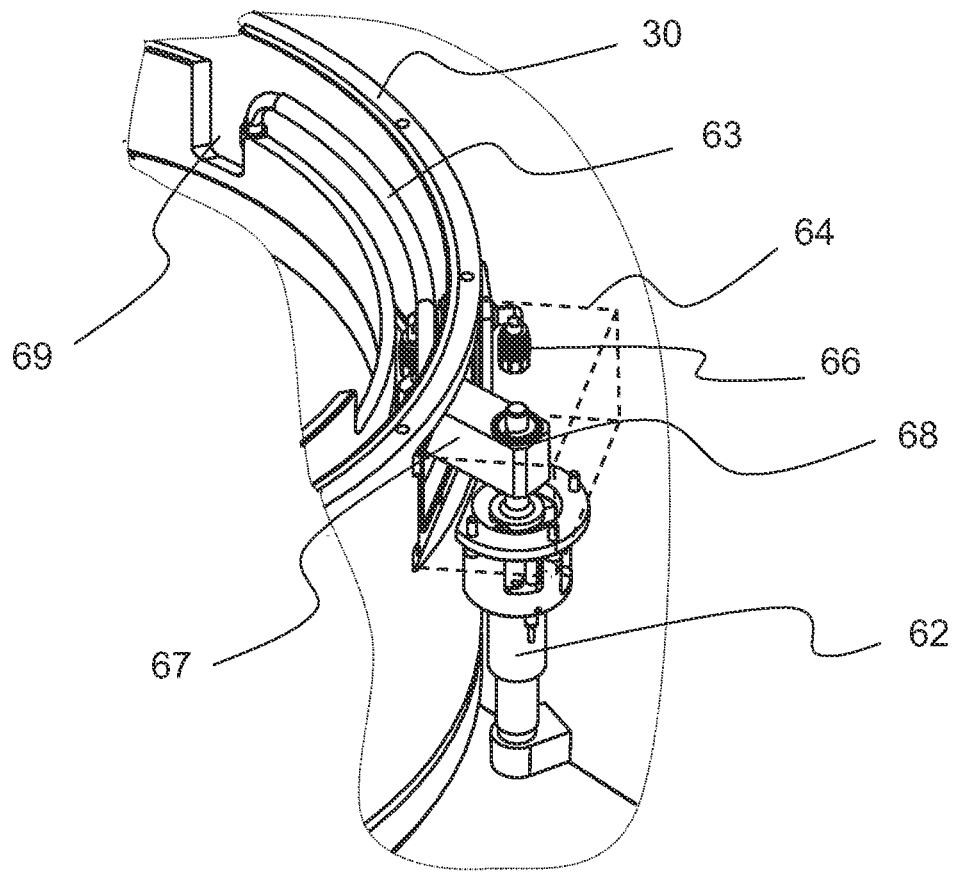
FIG. 9 is a fragmentary perspective view of the pivotal mounting of one of the media supply arms.

FIG. 9 shows further detail of the mechanism for driving the media supply and dispense arms between their standby and service positions. Cover 64 is indicated only in broken line in FIG. 9, to permit viewing the interior components of the drive mechanism. In practice cover 64 will be made of a solid material mounted in a sealed manner to the cylindrical wall 30 of the chamber, the cylindrical wall 30 having a cutout surrounded by the cover 64 to permit passage therethrough of the link 67 that carries the second media arm 63 on its distal end and which is connected to the output shaft 68 of drive unit 62 for example by a splined connection. Output shaft 68 penetrates cover 64 from below via a sealed bearing, thus drive unit 62 is disposed outside the chamber and is protected from the harsh chemical environment that exists within the chamber.

Thus, when drive unit 62 is actuated, link 67 will be pivoted over a range of motion dictated by the operating cycle of the drive unit 62, and which corresponds to displacement of the media supply arm 63 from its standby position to its service position. The size of the cutout in the cylindrical chamber wall 30 is therefore sized to accommodate that range of pivotal motion.

Lead-in 66 connects to the second media line 61 inside the chamber. Lead-in 66 may for example be a fluid coupling that traverses the cylindrical wall 30 of the chamber in a sealed manner, connecting to inlet tubing at its end outside the chamber and to second media line 61 at its end inside the chamber.

Also visible in FIG. 9 is an interior chamber wall positioned radially inwardly of cylindrical chamber wall 30, which together with wall 30 defines the stowage area 65 for the second media supply arm 63. That interior wall is provided with a cut-out 69 to permit passage of the downwardly-depending dispensing end of the media supply arm 63 as it is moved from its standby position in stowage area 65 to its service position in which the dispensing end of arm 63 is positioned above the center of the spin chuck.

It will be appreciated that first and second media supply arms 53 and 63 are equipped with essentially the same drive mechanisms in this embodiment, such that the description of the various components of one unit applies also to the other, although such description might not be repeated herein. Moreover, although the present embodiment of the invention is equipped with two media dispense arms, the number of such arms and their associated drive mechanisms could be only one, or, conversely, could be three or more.

Figure 10:
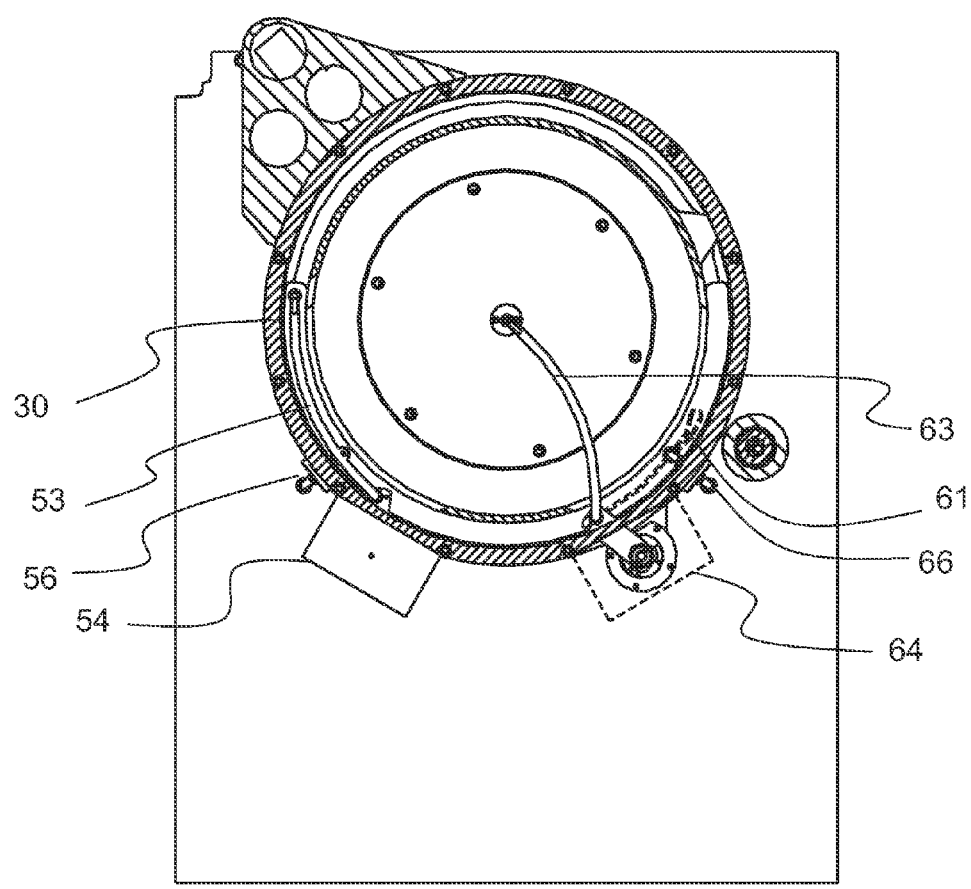
FIG. 10 is a radial section of the FIG. 1 embodiment, in which one of the media supply arms has been pivoted to its service position.

In FIG. 10, the first media arm 53 remains in its standby position, whereas second media supply arm 63 has been pivoted to the service position, in which the downwardly depending dispense nozzle of the arm 63 is positioned above the center of the spin chuck. Second media line 61 is more visible with arm 63 in its service position. That line 61 is depicted schematically in FIG. 10, but it will be seen that the length of line 61 is sufficient to accommodate the range of motion of the radially inward end of link 67, and so too its flexibility.

Figure 11:
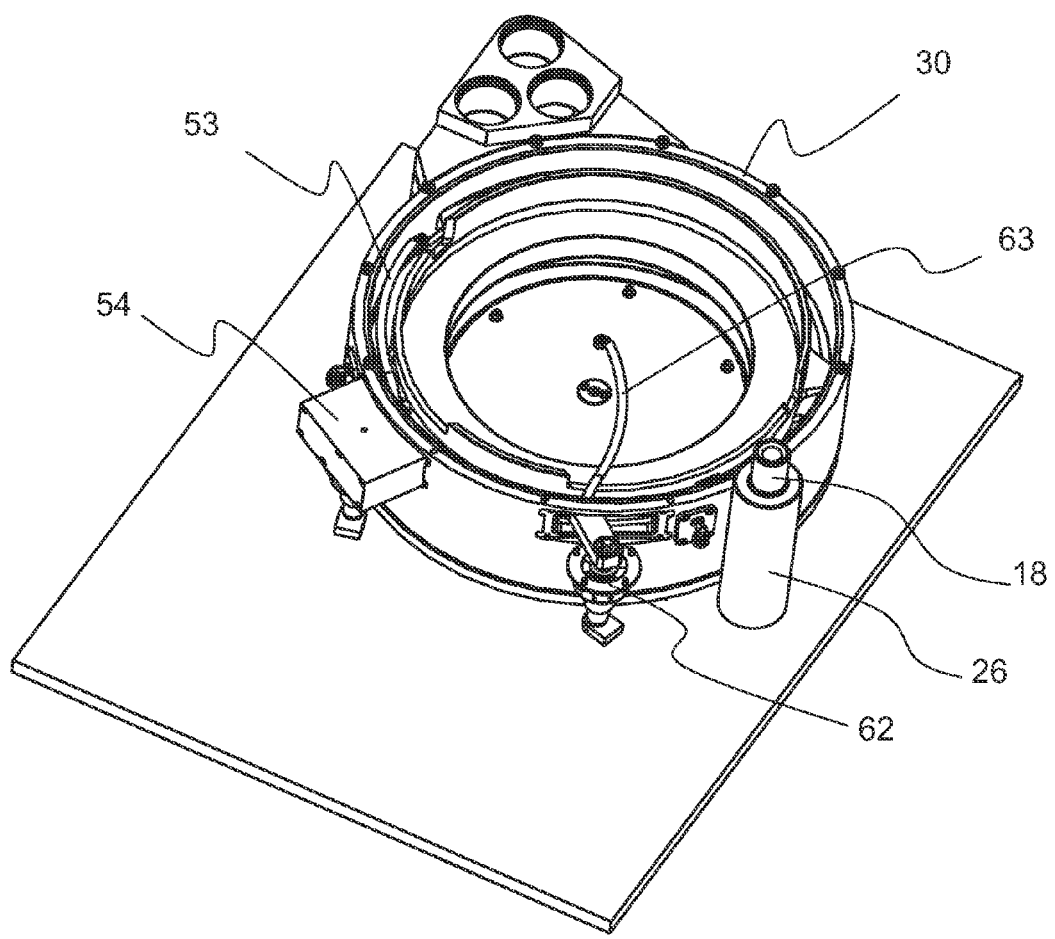
FIG. 11 is a perspective view of the FIG. 1 embodiment, with the upper chamber cover removed.

The perspective view of FIG. 11 corresponds to FIG. 10 and shows cover 54 in place whereas cover 64 is removed to reveal the drive linkage for media arm 63.

In use, the chamber will be opened to permit loading a wafer to be processed therein. This involves first actuating the motor 28, which is fixed by posts to the underside of base plate 15 and stationary relative thereto (see FIG. 3), but whose output shaft when extended causes lead-in 29 to be displaced upwardly, and with it the shaft 18, lid arm 22 and lid 20. Shaft 18 is preferably journaled in the lead-in 29 such that it is raised with the lead-in, but is rotatable relative to the lead-in 29.

Once the lid 20 has been raised to open the chamber, motor 27 is next actuated to drive link 19 in an arcuate range of motion about the axis of shaft 18. As link 19 is non-rotabably secured to shaft 18, this motion rotates shaft 18 and with it lid arm 22 and lid 20, such that the lid 20 is swung away from the opening defined by the upper annular chamber cover 32, to the position shown in FIG. 2. As shown in FIG. 3, motor 27 is itself mounted to the underside of base plate 15 via a pivot, to allow the pivotal motion of the link 19. Link 19 may be splined to shaft 18 and slide relative thereto during vertical displacement of shaft 18 driven by motor 28, or link 19 may be secured fast to shaft 18, and be driven by motor 27 at its opposite end via a pivot connection on which it may slide vertically when motor 28 is operated.

After the chamber has been opened as shown in FIG. 2, a wafer to be processed is loaded therein. Apparatus for transporting and loading wafers onto spin chucks are well known in the art. To receive a wafer, motor 76 is actuated to raise the spin chuck 70 via slider 74 to a position in the vicinity of the opening defined in the upper annular chamber cover 32. In particular, the spin chuck 70 may be raised to a position where it is just below the opening in cover 32, just above that opening, or flush with that opening.

It will be noted that the diameter of the opening in the upper annular cover 32 must obviously be greater than the outer diameter of a wafer to be processed in the chamber, but is preferably not of substantially greater diameter. For example, in the case of a 300 mm silicon wafer, the opening in cover 32 preferably has a diameter of approximately 320 mm. In general, the diameter of the opening in the upper end of the chamber should not exceed the diameter of a wafer to be processed by more than 50%, preferably by not more than 20%, and still more preferably by not more than 10%.

Spin chuck 70 is adapted to hold a wafer of a predetermined diameter, in this case 300 mm. Spin chuck 70 includes a peripheral series of gripping pins, which prevent the wafer from sliding laterally during processing. When spin chuck 70 is implemented as a Bernoulli chuck, a nitrogen gas flow supplied through the chuck and passing radially outwardly beneath the wafer provides the subjacent support of the wafer. Alternatively, the gripping pins may be configured with radially inwardly-facing surfaces that hold the wafer in its working position relative to the chuck, e.g. by having a shape complementary to the peripheral edge of the wafer, thereby providing both lateral and subjacent support.

Spin chuck 70 is then lowered by motor 76 to a working position at one of the upper, middle and lower levels 34, 35, 36, whereafter spin motor 72 commences to spin the spin chuck 70. Any desired combination of liquids and gases can then be supplied to the chamber interior, the liquids via media supply arms 53, 63 and the gases via showerhead lid 20.

It is preferred that one or more of the seals that seal the chamber be designed so as to permit controlled leakage of gas exteriorly of the chamber at a predetermined level of overpressure. In that way, a substantially oxygen-free atmosphere can be maintained within the chamber during processing of a wafer, while continuing to supply gas from showerhead lid 20 and/or through the shaft 78 acccumulation of excess pressure. This design also permits exclusion of oxygen without the need to rely upon the use of vacuum or the maintenance of completely impervious seals.

It will be appreciated that the design of this embodiment permits the gas showerhead and the media supply arms to supply gas and liquid simultaneously to the chamber interior. Furthermore, the design of the media supply arms 53, 63 and their associated drive mechanisms permits the arms to be disposed inside the chamber whereas their respective drive units are mounted outside the chamber. This provides the considerable advantage of preventing exposure of those drive units to the very aggressive chemicals often used in such processing modules.

While the present invention has been described in connection with various illustrative embodiments thereof, it is to be understood that those embodiments should not be used as a pretext to limit the scope of protection conferred by the true scope and spirit of the appended claims.

What is claimed is:

1. Apparatus for processing wafer-shaped articles, comprising a closed process chamber, a chuck located within said closed process chamber, at least one process liquid dispensing device disposed within said chamber, and a drive unit for the at least one process liquid dispensing device, the drive unit being drivingly connected to the at least one dispensing device to move the at least one dispensing device from a peripheral standby position to one or more active positions in which a dispensing end of the at least one dispensing device is moved radially inwardly of the chuck, said drive unit being mounted outside of said chamber.

2. The apparatus according to claim 1, wherein the chamber is a component of a process module for single wafer wet processing of semiconductor wafers.

3. The apparatus according to claim 1, wherein the chuck is a spin chuck having a drive shaft extending downwardly from the chamber.

4. The apparatus according to claim 1, wherein said chamber comprises a lid movable from a closed position to an open position permitting a wafer-shaped article to be introduced in or removed from the chamber, the lid comprising gas nozzles for injecting gas into the chamber when in the closed position, and the at least one process liquid dispensing device being operable to dispense liquid into the chamber while said lid is in the closed position.

5. The apparatus according to claim 4, further comprising a drive mechanism that moves said lid from the closed position to the open position, said drive mechanism being adapted to displace the lid both upwardly and laterally relative to the chamber.

6. The apparatus according to claim 4, wherein the lid is a gas showerhead comprising a region in which said gas nozzles are disposed, said region covering at least 50% of the area of a wafer-shaped article to be treated in the closed process chamber.

7. The apparatus according to claim 4, wherein the lid is arranged parallel to a wafer-shaped article received on said chuck.

8. The apparatus according to claim 4, wherein said drive mechanism that moves said lid from the closed position to the open position is mounted on a lower surface of a base plate, said closed process chamber being mounted on an upper surface of said base plate.

9. The apparatus according to claim 4, wherein said chamber has an upper circle-shaped opening and the lid is greater than said chamber opening and a seal is provided so that the lid seals against the upper chamber wall when pressed downwardly towards the chamber wall.

10. The apparatus according to claim 1, wherein the drive unit is a motor mounted on a side housing of said chamber, an output shaft of the motor passing into the side housing and driving a link that passes into said chamber and connects to the at least one liquid dispensing device.

11. The apparatus according to claim 1, wherein the at least one process liquid dispensing device is a media supply arm pivotably mounted within the chamber and movable from a peripheral standby position to one or more active positions in which a dispensing end of the media supply arm is moved radially inwardly of the chuck.

12. The apparatus according to claim 11, wherein said media supply arm has one end pivotally connected to a link that passes through a wall of said chamber and an opposite end provided with a dispensing nozzle.

13. The apparatus according to claim 1, wherein said chuck is vertically movable relative to said closed process chamber, and is configured to have at least three stopping positions, these being an uppermost position for loading and unloading a wafer-shaped article from the chuck, and at least two lower positions within the chamber, each of said at least two lower positions corresponding to a distinct process level of said chamber.

14. The apparatus according to claim 1, wherein said closed process chamber comprises a plurality of superposed process levels, each of said plurality of superposed process levels having a respective gas exhaust connected thereto, wherein the gas exhausts are individually controllable.

15. The apparatus according to claim 1, wherein the closed process chamber is mounted on an upper surface of a base plate, and further comprising a drive unit for said chuck, said drive unit for said chuck being mounted in a housing that depends from a lower surface of said base plate.

* * * * *